United States Patent
Zhang et al.

(10) Patent No.: US 10,895,593 B2
(45) Date of Patent: Jan. 19, 2021

(54) PARAMETER SELECTION METHOD AND APPARATUS, AND STORAGE MEDIUM FOR INSULATION DETECTION CIRCUIT

(71) Applicant: Contemporary Amperex Technology Co., Limited, Ningde (CN)

(72) Inventors: Wei Zhang, Ningde (CN); Zhimin Dan, Ningde (CN); Yizhen Hou, Ningde (CN); Meng Li, Ningde (CN); Weiping Sun, Ningde (CN); Teng Yu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 216 days.

(21) Appl. No.: 16/233,095

(22) Filed: Dec. 27, 2018

(65) Prior Publication Data
US 2019/0235013 A1    Aug. 1, 2019

(30) Foreign Application Priority Data

Feb. 1, 2018 (CN) .......................... 2018 1 0102550

(51) Int. Cl.
*G01R 31/12* (2020.01)
*G01R 31/3835* (2019.01)
(Continued)

(52) U.S. Cl.
CPC ....... *G01R 31/1263* (2013.01); *G01R 27/025* (2013.01); *G01R 31/007* (2013.01);
(Continued)

(58) Field of Classification Search
USPC .................................. 324/527, 541, 551, 557
See application file for complete search history.

(56) References Cited

U.S. PATENT DOCUMENTS 4,422,034 A * 12/1983 Matsuno .............. G01R 27/025
324/541
7,005,860 B2    2/2006 Yamamoto et al.
(Continued)

FOREIGN PATENT DOCUMENTS

CN        101192828 A    6/2008
CN        101707265 A    5/2010
(Continued)

OTHER PUBLICATIONS

The extended European Search Report for European Application No. 19150220.2, dated Jun. 19, 2019, 9 pages.
(Continued)

*Primary Examiner* — Vincent Q Nguyen
(74) *Attorney, Agent, or Firm* — Law Offices of Liaoteng Wang (57) ABSTRACT

The present disclosure provides a parameter selection method, apparatus, and computer readable storage medium for an insulation detection circuit. The parameter selection method includes determining an allowable injection frequency range of an AC signal to be injected, according to a predetermined resistance range of an insulation resistance of the power battery under test and a predetermined resistance calculation cycle of the insulation resistance; and selecting an output frequency of the signal generation module according to a lowest frequency to be generated by the signal generation module and the allowable injection frequency range.

12 Claims, 7 Drawing Sheets

(51) Int. Cl.
*G01R 27/02* (2006.01)
*G01R 31/00* (2006.01)
*G01R 31/50* (2020.01)
*G01R 31/389* (2019.01)

(52) U.S. Cl.
CPC ....... *G01R 31/389* (2019.01); *G01R 31/3835* (2019.01); *G01R 31/50* (2020.01)

(56) References Cited

U.S. PATENT DOCUMENTS

| | | | | |
|---|---|---|---|---|
| 2001/0045626 | A1* | 11/2001 | Hirose | H01L 23/647 |
| | | | | 257/666 |
| 2014/0058687 | A1 | 2/2014 | Wang et al. | |
| 2014/0197683 | A1* | 7/2014 | Migita | B60L 50/16 |
| | | | | 307/9.1 |
| 2015/0072109 | A1* | 3/2015 | Liang | H05K 1/0213 |
| | | | | 428/144 |
| 2017/0160327 | A1* | 6/2017 | Jung | G01R 31/12 |

FOREIGN PATENT DOCUMENTS

| | | |
|---|---|---|
| CN | 101834457 A | 9/2010 |
| CN | 102223094 A | 10/2011 |
| CN | 105785129 A | 7/2016 |
| CN | 106597242 A | 4/2017 |
| EP | 2613162 A1 | 7/2013 |
| EP | 3422025 A1 | 1/2019 |
| JP | 2013036884 A | 2/2013 |
| WO | 2017161870 A1 | 9/2017 |

OTHER PUBLICATIONS

The First Office Action and search report dated Dec. 18, 2019 for Chinese Application No. 201810102550.2, 7 pages.
Peng Peng et al, "The Research of Insulation Detection Technology of DC Power", Chinese Master's Theses Full-text Database, Engineering Science and Technology vol. 2. No. 2, dated Feb. 15, 2015, 1 page.

* cited by examiner

```
┌─────────────────────────────────────────────────────────┐
│ Determine an allowable injection frequency range of an AC│
│ signal to be injected, according to a predetermined      │
│ resistance range of an insulation resistance of the      │──601
│ power battery under test and a predetermined resistance  │
│ calculation cycle of the insulation resistance           │
└─────────────────────────────────────────────────────────┘
                            │
                            ▼
┌─────────────────────────────────────────────────────────┐
│ Select an output frequency of the signal generation      │
│ module according to a lowest frequency to be generated   │──602
│ by the signal generation module and the allowable        │
│ injection frequency range                                │
└─────────────────────────────────────────────────────────┘
```

Fig. 6

```
┌─────────────────────────────────────────────────────────┐
│ Determine an allowable injection frequency range of an AC│
│ signal to be injected, according to a predetermined      │
│ resistance range and a predetermined resistance          │──601
│ calculation cycle of an insulation resistance of the     │
│ power battery under test                                 │
└─────────────────────────────────────────────────────────┘
                            │
                            ▼
┌─────────────────────────────────────────────────────────┐
│ Obtain a maximum frequency among the lowest frequency    │
│ to be generated by the signal generation module, a       │
│ frequency corresponding to a predetermined minimum       │──6021
│ signal injection cycle, and a frequency corresponding    │
│ to a predetermined minimum resistance calculation cycle  │
└─────────────────────────────────────────────────────────┘
                            │
                            ▼
┌─────────────────────────────────────────────────────────┐
│ Determine whether the maximum frequency is within the    │──6022
│ allowable injection frequency range                      │
└─────────────────────────────────────────────────────────┘
                            │
                            ▼
┌─────────────────────────────────────────────────────────┐
│ Apply the maximum frequency as the output frequency of   │
│ the signal generation module if the maximum frequency is │──6023
│ within the allowable injection frequency range           │
└─────────────────────────────────────────────────────────┘
```

PARAMETER SELECTION METHOD AND APPARATUS, AND STORAGE MEDIUM FOR INSULATION DETECTION CIRCUIT

CROSS-REFERENCE TO RELATED APPLICATION

This application is based upon and claims priority to Chinese Patent Application No. 201810102550.2, filed on Feb. 1, 2018, the content of which is incorporated herein by reference in its entirety.

TECHNICAL FIELD

The present disclosure relates to the field of batteries, and particularly to a parameter selection method and apparatus, and a computer readable storage medium for an insulation detection circuit.

BACKGROUND

A power battery is responsible for storing and providing power. In use, it is necessary to design an insulation detection circuit for the power battery to monitor in real time if an insulation resistance of the power battery meets a standard, so as to avoid high voltage safety issues caused in the case that the insulation resistance between positive and negative electrodes of the power battery does not meet the standard.

In order to detect the insulation resistance of the power battery, according to a conventional method, an alternating current (AC) source is applied to inject an AC signal into the power battery under test, a voltage division resistor and an isolation module are arranged in turn between the AC source and the power battery under test, and then the insulation resistance can be calculated by detection of a voltage signal between the isolation module and the voltage division resistor and a voltage signal of the AC source.

However, inventors of the present application found that according to data provided by an original equipment manufacturer (OEM), the insulation resistance of the power battery under test may vary within a resistance range. When the insulation resistance varies within the resistance range, it is essential to detect a significant variation of the voltage signal between the isolation module and the voltage division resistor, so that the insulation resistance can be calculated with higher accuracy.

SUMMARY

The embodiments of the present disclosure provides a parameter selection method and apparatus, and a computer readable storage medium for an insulation detection circuit.

In a first aspect, a parameter selection method for an insulation detection circuit is provided in the embodiments of the present disclosure. The insulation detection circuit includes a signal generation module, a voltage division module and an isolation module that are connected in turn. The isolation module is connected to a positive electrode of a power battery under test. The parameter selection method includes determining an allowable injection frequency range of an AC signal to be injected, according to a predetermined resistance range of an insulation resistance of the power battery under test and a predetermined resistance calculation cycle of the insulation resistance; and selecting an output frequency of the signal generation module according to a lowest frequency to be generated by the signal generation module and the allowable injection frequency range.

In an implementation of the first aspect, the selecting an output frequency of the signal generation module according to a lowest frequency to be generated by the signal generation module and the allowable injection frequency range includes obtaining a maximum frequency among the lowest frequency to be generated by the signal generation module, a frequency corresponding to a predetermined minimum signal injection cycle, and a frequency corresponding to a predetermined minimum resistance calculation cycle; determining whether the maximum frequency is within the allowable injection frequency range; and applying the maximum frequency as the output frequency of the signal generation module if the maximum frequency is within the allowable injection frequency range.

In an implementation of the first aspect, the determining an allowable injection frequency range of an AC signal to be injected, according to a predetermined resistance range of an insulation resistance of the power battery under test and a predetermined resistance calculation cycle of the insulation resistance includes determining a maximum injection frequency of the allowable injection frequency range according to the predetermined resistance range, a predetermined sampling precision and a predetermined sampling resolution of the voltage signal between the isolation module and the voltage division module; and determining a minimum injection frequency of the allowable injection frequency range according to the predetermined resistance calculation cycle.

In an implementation of the first aspect, the determining a maximum injection frequency of the allowable injection frequency range according to the predetermined resistance range, a predetermined sampling precision and a predetermined sampling resolution of the voltage signal between the isolation module and the voltage division module includes obtaining a first voltage amplitude of the voltage signal between the isolation module and the voltage division module when the insulation resistance of the power battery under a present output frequency of the signal generation module is a maximum resistance in the predetermined resistance range; obtaining a second voltage amplitude of the voltage signal between the isolation module and the voltage division module when the insulation resistance of the power battery under the present output frequency is 1+n times of the maximum resistance, wherein the n is the predetermined sampling precision; calculating a difference between the first voltage amplitude and the second voltage amplitude; if the difference is equal to the predetermined sampling resolution, applying the present output frequency as the maximum injection frequency of the allowable injection frequency range; and if the difference is not equal to the predetermined sampling resolution, adjusting the output frequency of the signal generation module and taking the adjusted output frequency as a new present output frequency until the calculated difference corresponding to the new present output frequency is equal to the predetermined sampling resolution.

In an implementation of the first aspect, the determining a minimum injection frequency of the allowable injection frequency range according to the predetermined resistance calculation cycle includes applying an inverse of the predetermined resistance calculation cycle as the minimum injection frequency of the allowable injection frequency range.

In an implementation of the first aspect, the maximum injection frequency of the allowable injection frequency range is 5 Hz.

In an implementation of the first aspect, the minimum injection frequency of the allowable injection frequency range is 0.1 Hz.

In an implementation of the first aspect, the parameter selection method further includes obtaining a maximum value of an equivalent impedance of the insulation resistance and a parasitic capacitance of the power battery under test according to the selected output frequency of the signal generation module, the predetermined resistance range and a predetermined capacitance range; and deriving a capacitance of the isolation module by using the maximum value of the equivalent impedance as a capacitive reactance of the isolation module.

In an implementation of the first aspect, the insulation detection circuit further includes an Analog-to-Digital Converter ADC to acquire the voltage signal between the isolation module and the voltage division module, and the parameter selection method further includes adjusting the resistance of the voltage division module based on the maximum value of the equivalent impedance, the selected output frequency of the signal generation module and a determined capacitance of the isolation module, so that the voltage signal acquired by the ADC is between half and two-thirds of a full scale of the ADC; and from the resistance range of the voltage division module in which any resistance causes that the voltage signal acquired by the ADC is between the half and the two-thirds of the full scale of the ADC, selecting a resistance arbitrarily as a present resistance of the voltage division module.

In a second aspect, a parameter selection apparatus for an insulation detection circuit is provided in the embodiments of the present disclosure. The insulation detection circuit comprises a signal generation module, a voltage division module and an isolation module that are connected in turn. The isolation module is connected to a power battery under test. The parameter selection apparatus includes a determination module configured to determine an allowable injection frequency range of an AC signal to be injected according to a predetermined resistance range of an insulation resistance of the power battery under test and a predetermined resistance calculation cycle of the insulation resistance; and a selection module configured to select an output frequency of the signal generation module according to a lowest frequency to be generated by the signal generation module and the allowable injection frequency range.

In an implementation of the second aspect, the parameter selection apparatus further includes a first calculation module configured to obtain a maximum value of an equivalent impedance of the insulation resistance and a parasitic capacitance of the power battery under test according to the selected output frequency of the signal generation module, the predetermined resistance range and a predetermined capacitance range; and a second calculation module configured to derive a capacitance of the isolation module by using the maximum value of the equivalent impedance as a capacitive reactance of the isolation module.

In a third aspect, a parameter selection device for an insulation detection circuit is provided in the embodiments of the present disclosure. The parameter selection device includes a memory configured to store executable program codes; and a processor configured to read the executable program codes stored in the memory to perform the above-described parameter selection method for the insulation detection circuit.

In a fourth aspect, a computer readable storage medium having instructions stored thereon is provide in the embodiments of the present disclosure. The instructions, when executed on a computer, cause the computer to perform the above-described parameter selection method for the insulation detection circuit.

BRIEF DESCRIPTION OF THE DRAWINGS

The invention may be better understood from the following description of the specific embodiments of the invention, taken in conjunction with the accompanying drawings, in which like or similar reference numerals indicate identical or similar features.

DETAILED DESCRIPTION

The features and exemplary embodiments of various aspects of the present disclosure are described in detail below. In the following detailed description, numerous specific details are set forth in order to provide a thorough understanding of the embodiments of the present disclosure.

The embodiments of the present disclosure provide a parameter selection method, apparatus, and computer readable storage medium for an insulation detection circuit. With the parameter selection method in the embodiments of the present disclosure, calculation accuracy of an insulation resistance can be improved.

It should be noted that the power battery under test in the embodiments of the present disclosure may be a lithium-ion battery, a lithium-metal battery, a lead-acid battery, a nickel-cadmium battery, a nickel-metal hydride battery, a lithium-sulfur battery, a lithium-air battery, or a sodium-ion battery, which is not limited herein. In terms of scale, the power battery under test can be a single cell or a battery module or a battery pack, which is not limited herein either.

The battery management system includes the above insulation detection circuit. For example, the above insulation detection circuit may be integrated in the battery management system.

Figure 1:
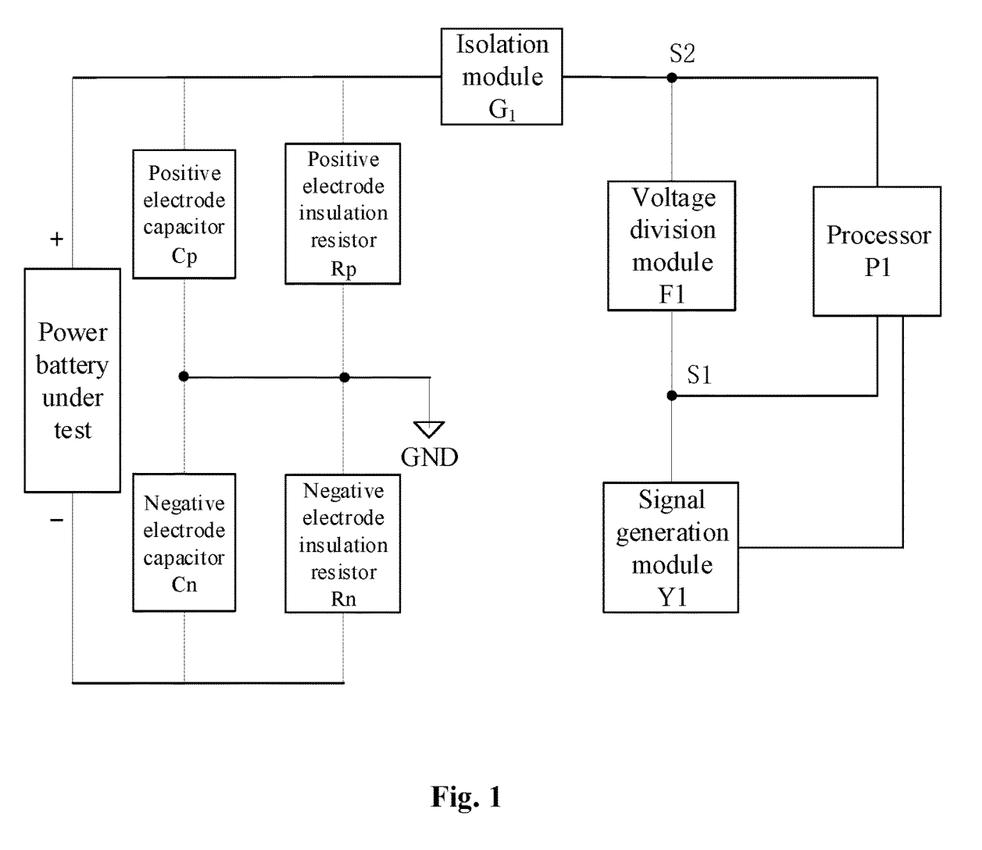
FIG. 1 is a schematic structural diagram of an insulation detection circuit according to a first embodiment of the present disclosure.

FIG. 1 is a schematic structural diagram of an insulation detection circuit according to a first embodiment of the present disclosure. As shown in FIG. 1, the insulation detection circuit includes an isolation module G1, a voltage division module F1, a signal generation module Y1, a first sampling point S1, a second sampling point S2 and a processor P1.

A first end of the isolation module G1 is connected to a positive electrode of the power battery under test, and a second end of the isolation module G1 is connected to the second sampling point S2. The isolation module G1 may be configured to isolate a high-voltage signal of the power battery under test, so as to prevent a high-voltage source from interfering with a sampled signal at a low-voltage side.

The signal generation module Y1 is connected to the first sampling point S1. The signal generation module Y1 may be configured to inject a low frequency AC signal into a detection system and provide the first sampling point S1 with a first sampled signal of a predetermined frequency.

A first end of the voltage division module F1 is connected to the first sampling point S1, and a second end of the voltage division module F1 is connected to the second sampling point S2. The voltage division module F1 may be configured to provide the second sampling point S2 with a second sampled signal.

The processor P1 may be configured to calculate the insulation resistance of the power battery under test according to the first sampled signal and the second sampled signal.

A positive electrode capacitor Cp, a negative electrode capacitor Cn, a positive electrode insulation resistor Rp and a negative electrode insulation resistor Rn of the power battery under test are also shown in FIG. 1.

It can be understood that the positive electrode capacitor Cp and the negative electrode capacitor Cn are equivalent capacitors of the power battery under test, the positive electrode insulation resistor Rp is the insulation resistor of the positive electrode of the power battery under test relative to the low-voltage ground, and the negative electrode insulation resistor Rn is the insulation resistor of a negative electrode of the power battery under test relative to the low-voltage ground.

In the embodiment of the present disclosure, an AC voltage signal generated by the signal generation module Y1 can be acquired from the first sampling point S1, and an AC voltage signal between the voltage division module F1 and the isolation module G1 can be acquired from the second sampling point S2. The AC voltage signal between the voltage divider module F1 and the isolation module G1 may be affected by the insulation resistance of the power battery under test. Thus based on Kirchhoff's law, the insulation resistance of the power battery under test can be calculated by a comparison between the AC voltage signal at the first sampling point S1 and the AC voltage signal at the second sampling point S2.

The embodiment of the present disclosure provides the insulation detection circuit including the isolation module G1, the voltage division module F1, the signal generation module Y1, the first sampling point S1 and the second sampling point S2. The first end of the isolation module G1 is connected to the positive electrode of the power battery under test, and the second end of the isolation module G1 is connected to the second end of the voltage division module F1. The isolation module G1 can isolate the high-voltage signal of the power battery under test from impacting on a low-voltage sampling circuit. Compared with the conventional method of directly injecting a high frequency AC signal into the power battery, in the embodiment of the present disclosure, the high-voltage signal of the power battery under test can be isolated from impacting on a low-voltage sampling circuit, so that the first sampled signal obtained from the first sampling point S1 and the second sampled signal obtained from the second sampling point S2 can be made more accurate and accordingly the detection accuracy of the insulation resistance can be improved.

In addition, since the insulation detection circuit in the embodiment of the present disclosure only needs to further include the isolation module G1 which can be specifically implemented by a capacitor, it may have the advantage of low cost.

In addition, according to the embodiment of the present disclosure, since it is only needed to detect the AC voltage signal at the first sampling point S1 and the AC voltage signal at the second sampling point S2 in order to calculate the insulation resistance of the power battery under test, the calculation speed can be fast and the stability of the system will not be impacted.

In some embodiments, the signal generation module Y1 can be a Direct Digital Synthesis (DDS) waveform generator. Stability and accuracy of a frequency of a signal from the DDS waveform generator can reach the same level as a reference frequency and the frequency can be finely adjusted over a wide frequency range. A signal source designed in this way can work in a modulation state, in which an output level can be adjusted to obtain an output of various waveforms, such as a triangular wave, a square wave, and the like.

In other embodiments, the first sampled signal generated by the signal generation module Y1 may be a low-frequency AC signal. In other words, a low-frequency AC signal may be injected into the power battery under test. For example, the frequency may be less than or equal to 50 kHz. In comparison to the high frequency AC signal being injected into the power battery under test, the low frequency AC signal is not easily impacted by the high-voltage signal of the power battery under test, so that the detection accuracy of the insulation detection circuit can be further improved.

As shown in FIG. 1, the processor P1 may be further configured to output an enable control signal to the signal generation module Y1 in response to the desire of detecting the power battery under test, so as to perform an automatic control to enable or disable the insulation detection circuit.

Figure 2:
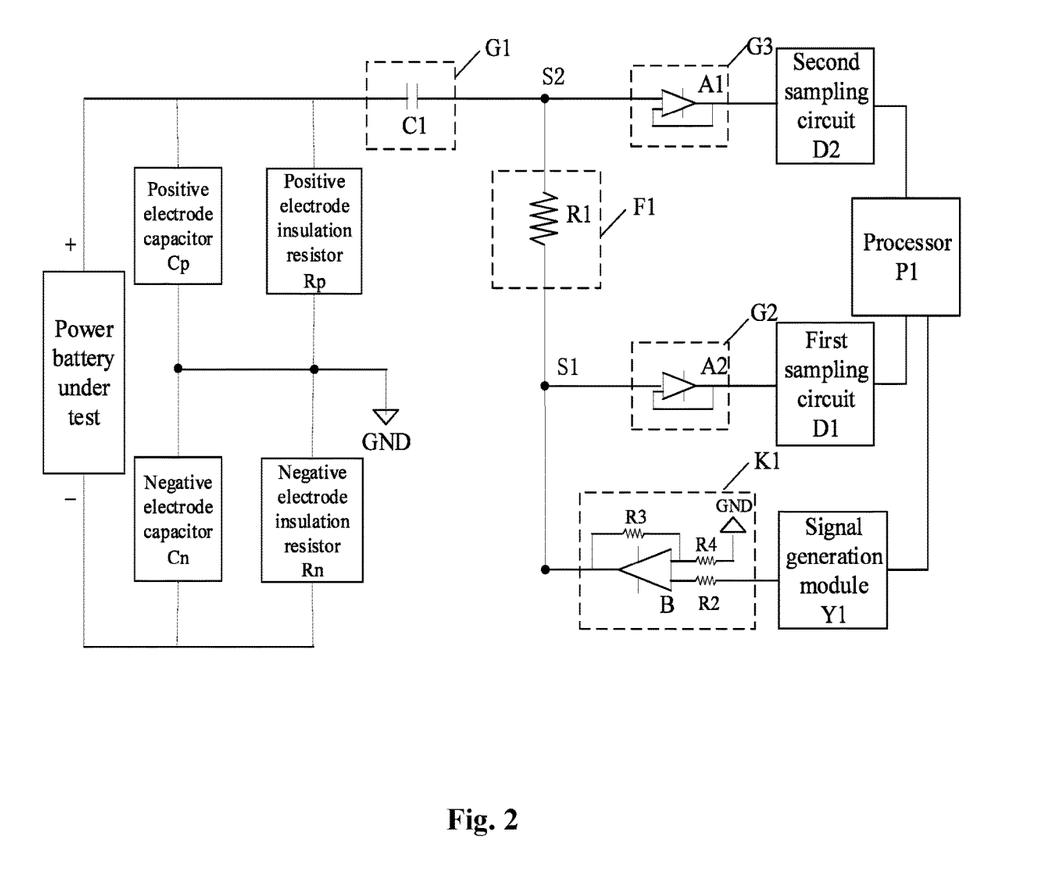
FIG. 2 is a schematic structural diagram of an insulation detection circuit according to a second embodiment of the present disclosure.

FIG. 2 is a schematic structural diagram of an insulation detection circuit according to a second embodiment of the present disclosure. FIG. 2 shows components of each module in FIG. 1.

The voltage division module F1 may be a voltage division resistor R1. The voltage division resistor R1 can function as a voltage divider. A variation range of the sampled signal at the second sampling point S2 can be adjusted by changing the resistance of the voltage division resistor R1.

The isolation module G1 may be an isolation capacitor C1. The isolation capacitor C1 can isolate high voltages at the power battery side from low-voltage sampled signals. In addition, by changing the capacitance of the isolation capacitor C1, the isolation effect between high voltages at the power battery side and a low-voltage sampling circuit can be adjusted.

The insulation detection circuit shown in FIG. 2 further includes a first sampling circuit D1 and a second sampling circuit D2. In the embodiment of the present disclosure, the processor P1 may directly acquire an AC signal from the first sampling point S1 or the second sampling point S2, or may acquire the AC signal from the first sampling point S1 or the second sampling point S2 via a dedicated sampling circuit.

A first end of the first sampling circuit D1 is connected to the first sampling point S1, and a second end of the first sampling circuit D1 is connected to the processor P1. The first sampling circuit D1 may be configured to acquire the first sampled signal from the first sampling point D1. A first end of the second sampling circuit D2 is connected to the second sampling point S2, and a second end of the second sampling circuit D2 is connected to the processor P1. The second sampling circuit D2 may be configured to acquire the second sampled signal from the second sampling point S2. A person skilled in the art can select an appropriate sampling circuit based on practical needs, which is not limited herein.

The insulation detection circuit shown in FIG. 2 further includes an isolation module G2 corresponding to the first sampling circuit D1 for isolating signal interference of the first sampling circuit D1 on the first sampling point S1, and an isolation module G3 corresponding to the second sampling circuit D2 for isolating signal interference of the second sampling circuit D2 on the second sampling point S2. Specifically, the isolation module G2 and the isolation module G3 can be implemented by voltage followers (see A1 and A2 in FIG. 2 and FIG. 3).

The insulation detection circuit shown in FIG. 2 further includes a signal amplification module K1 for amplifying a voltage amplitude of a sine wave generated by the signal generation module Y1. Specifically, the signal amplification module K1 may include a signal amplifier B, a first amplification resistor R2, a second amplification resistor R3, and a third amplification resistor R4. A first input terminal of the signal amplifier B is connected to the signal generation module Y1, and the first amplification resistor R2 is located on a line between the first input terminal of the signal amplifier B and the signal generation module Y1. A second input terminal of the signal amplifier B is connected to an output terminal of the signal amplifier B, and the second amplification resistor R3 is located on a line between the second input terminal of the signal amplifier B and the output terminal of the signal amplifier B. The output terminal of the signal amplifier B is connected to the first sampling point S1. The second input terminal of the signal amplification module K1 is further connected to the reference voltage terminal GND, and the third amplification resistor R4 is located on a line between the second input terminal of the signal amplification module K1 and the reference voltage terminal GND.

In the embodiments of the present disclosure, the processor P1 may directly acquire the AC signal from the first sampling point S1 or the second sampling point S2, or may acquire the AC signal from the first sampling point S1 or the second sampling point S2 via a dedicated sampling circuit.

To facilitate understanding by those skilled in the art, the process of calculating the insulation resistance of the power battery under test based on the above-mentioned insulation detection circuit according to embodiments of the present invention will be described in detail below.

Since the power battery under test has a very small internal resistance, the power battery can be considered as equivalent to a short circuit. That is, FIG. 2 is equivalent to FIG. 3.

Figure 3:
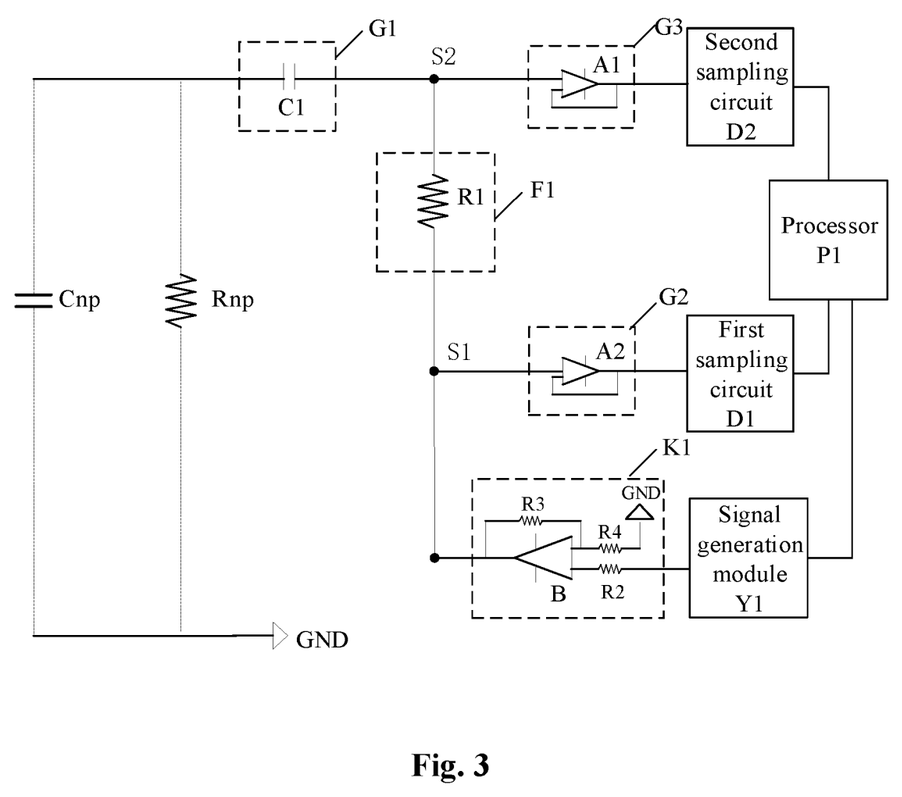
FIG. 3 is a schematic structural diagram of an equivalent circuit of the insulation detection circuit in FIG. 2.

In FIG. 3, Rnp is the resistance obtained by the parallel connection of the positive electrode insulation resistor Rp and the negative electrode insulation resistor Rn, that is, Rnp=Rn//Rp; and Cnp is the capacitance (also referred to as a parasitic capacitance of the power battery under test) obtained by the parallel connection of the positive electrode capacitor Cp and the negative electrode capacitor Cn, that is, Cnp=Cn//Cp. The obtained insulation resistance Rnp is smaller than the resistance of Rn or Rp. In the embodiments of the present invention, the insulation resistance Rnp can be used as a standard for measuring the insulation performance.

The derivation process of the insulation resistance Rnp of the power battery under test of the insulation detection circuit will be described in detail with reference to FIG. 3.

According to series and parallel formulas, the equivalent impedance Znp of the parasitic capacitance Cnp and the insulation resistance Rnp can be expressed as follows.

$$Znp = \frac{Rnp \times ZCnp}{Rnp + ZCnp} \quad (1)$$

Here, ZCnp is a capacitive reactance of the parasitic capacitance Cnp, and the equivalent impedance Znp can be expressed in a vector form as follows.

$$\frac{Rnp}{w^2 \times Cnp^2 \times Rnp^2 + 1} - \frac{w \times Cnp \times Rnp^2}{w^2 \times Cnp^2 \times Rnp^2 + 1} \times j \quad (2)$$

Here, w is an angular frequency of a sine wave AC signal generated by the signal generation module Y1, and j is the imaginary unit.

Assuming that the equivalent impedance of the parasitic capacitance Cnp, the insulation resistance Rnp and the isolation capacitor C1 is Znp1, according to Kirchhoff's law, voltage amplitudes of a sine wave AC signal between the isolation capacitor C1 and the voltage division resistor (also referred to as a sampling resistor) R1 and the sine wave AC signal generated by the signal generation module Y1 (i.e., the sine wave AC signal provided by the second sampling point S2 and the sine wave AC signal provided by the first sampling point S1) have the following relationship:

$$\frac{U}{u} = \frac{Znp1 + R1}{Znp1} \quad (3)$$

In the formula, U is the amplitude of the sine wave AC signal generated by the signal generation module Y1 and u is the amplitude of the sine wave AC signal between the isolation capacitor C1 and the voltage division resistor R1.

According to Kirchhoff's law, the relationship between the equivalent impedance Znp of the parasitic capacitance Cnp and the insulation resistance Rnp and the equivalent impedance Znp1 of the parasitic capacitance Cnp, the insulation resistance Rnp and the isolation capacitor C1 can be expressed as:

$$Znp = Znp1 - \frac{1}{j \times w \times C1} \quad (4)$$

Assuming that the phase shift of the sine wave AC signal between the isolation capacitor C1 and the voltage division resistor R1 relative to the sine wave AC signal generated by the signal generation module Y1 is θ, the sine wave AC signal between the isolation capacitor C1 and the voltage division resistor R1 can be expressed in a vector form as follows:

$$u = u \times \cos(\theta) + u \times \sin(\theta) \times j \quad (5)$$

In order to eliminate the phase shift θ, the phase shift θ can be converted into an expression of measurable values. For example, it can be assumed that the instantaneous voltage UA of the sine wave AC signal generated by the signal generation module Y1 can be expressed by the following function of time:

$$UA = U \times \sin(w \times t) + M \quad (6)$$

It can be assumed that the instantaneous voltage UB of the sine wave AC signal between the isolation capacitor C1 and the voltage division resistor R1 at the same moment can be expressed by the following function of time:

$$UB = u \times \sin(w \times t + \theta) + M \quad (7)$$

Here, M is the bias voltage, and t is the time. To improve the calculation accuracy of the insulation resistance, it is desired to simultaneously obtain the first instantaneous voltage at the rising edge of the waveform in the first sampled signal as the UA and the second instantaneous voltage at the rising edge of the waveform in the second sampled signal as the UB.

Combining formula (5)-formula (7), the following formula for calculating the phase shift θ can be derived:

$$\theta = a \times \sin\left(\frac{UB - M}{u}\right) - a \times \sin\left(\frac{UA - M}{U}\right) \quad (8)$$

Combining formula (3), formula (4) and formula (8) and after simplification, the following formula can be derived:

$$Znp = \frac{U \times u \times R1 \times \cos(\theta) - u^2 \times R1}{U^2 - 2 \times U \times u \times \cos(\theta) + u^2} + \left(\frac{U \times u \times R1 \times \sin(\theta)}{U^2 - 2 \times U \times u \times \cos(\theta) + u^2} + \frac{1}{w \times C1}\right) \times j \quad (9)$$

Combining formula (2) and formula (9), the insulation resistance Rnp of the power battery under test can be derived as follows:

$$Rnp = \quad (10)$$

$$\frac{(U \times \cos(\theta) - u) \times u \times R1}{U^2 - 2 \times U \times u \times \cos(\theta) + u^2} \times \left[ \frac{(w \times C1 \times U \times u \times R1 \times \sin(\theta) + U^2 + u^2 - 2 \times U \times u \times \cos(\theta))^2}{w^2 \times C1^2 \times u^2 \times R1^2 \times (U \times \cos(\theta) - u)^2} + 1 \right]$$

As described above, according to the embodiments of the present invention, only two sets of instantaneous voltages UA and UB of the first sampling point S1 and the second sampling point S2 at the same moment need to be measured. Then based on Kirchhoff's law, the sine wave signal acquired at the first sampling point S1 and the sine wave signal acquired at the second sampling point S2 can be processed, so as to calculate the phase shift θ of the second sampling point S2 relative to the first sampling point S1 and further obtain the insulation resistance of the power battery under test according to formula (10).

Based on the advantages of the above-mentioned insulation detection circuit provided by the embodiments of the present disclosure in the calculation accuracy, the calculation accuracy of the insulation resistance will determine promotion value of the insulation detection circuit. The embodiments of the present disclosure mainly consider to determine the relationship between the values of the isolation capacitor C1 and the voltage division resistor R1 and the frequency of the AC source with respect to the variation range of the insulation resistance and the range of the parasitic capacitance Cnp of the power battery relative to the low-voltage ground, so as to improve the calculation accuracy of the insulation resistance.

According to the data provided by the OEM, both the negative electrode insulation resistor Rn and the positive electrode insulation resistor Rp of the power battery under test vary between Rmin and Rmax, and then it can be derived that the insulation resistance Rnp of the power battery under test ranges from Rmin/2 to Rmax/2; both the negative electrode capacitor Cn and the positive electrode capacitor Cp of the power battery under test vary between Cmin and Cmax, and then it can be derived that the parasitic capacitance Cnp of the power battery under test ranges from 2Cmin to 2Cmax.

According to the embodiments of the present invention, when the insulation resistance Rnp varies between Rmin/2 and Rmax/2, the change of the voltage signal between the isolation capacitor C1 and the voltage division resistor R1 should be relatively large, so that the calculation of the insulation resistance Rnp will be more accurate.

The equivalent impedance Znp of the parasitic capacitance Cnp and the insulation resistance Rnp can be expressed as:

$$Znp = \frac{Rnp}{Cnp \cdot Rnp \cdot w + 1} \quad (11)$$

Here, w is the angular frequency of the sine wave AC signal generated by the signal generation module Y1. If an output frequency of the sine wave generated by the signal generation module Y1 is f then the corresponding angular frequency of the sine wave is w=2π×f.

A ratio F of the voltage amplitude of the sampled signal between the isolation capacitor C1 and the voltage division resistor R1 relative to the voltage amplitude of the sampled signal generated by the signal generation module Y1 is:

$$F = \frac{Znp + \frac{1}{wC1}}{Znp + \frac{1}{wC1} + R1} \quad (12)$$

It can be seen from the above that the change of the voltage signal between the isolation capacitor C1 and the voltage division resistor R1 can be represented by the ratio F. The larger the ratio F is, the greater the change of the voltage signal between the isolation capacitor C1 and the voltage division resistor R1 is.

Figure 4:
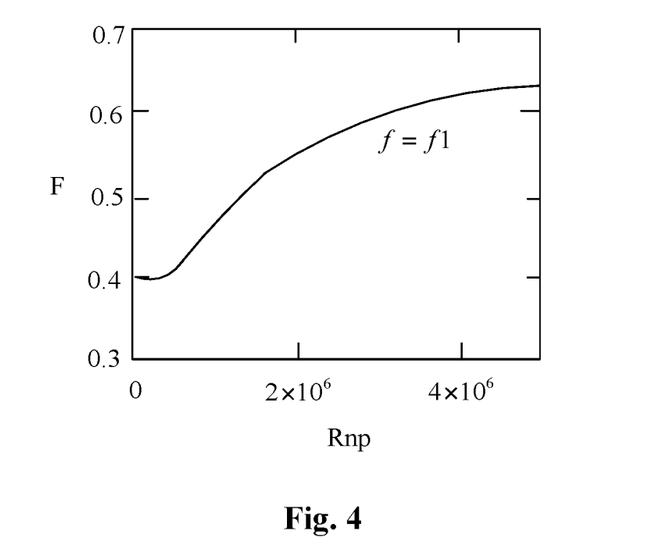
FIG. 4 is a schematic diagram illustrating a relationship between a ratio F and a Rnp when a frequency of a sine wave is f1 according to an embodiment of the present disclosure.
Figure 5:
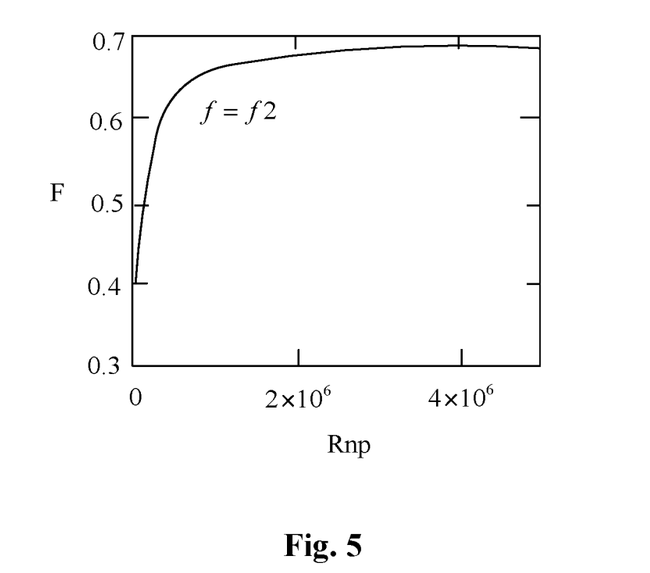
FIG. 5 is a schematic diagram illustrating a relationship between a ratio F and a Rnp when a frequency of a sine wave is f2 according to an embodiment of the present disclosure.

According to the formula (12), graphs as shown in FIG. 4 and FIG. 5 can be obtained.

FIG. 4 is a changing curve of the ratio F versus the insulation resistance Rnp of the power battery under test when the frequency of the sine wave generated by the signal generation module Y1 is f1, i.e. w=2π×f1.

FIG. 5 is a changing curve of the ratio F versus the insulation resistance Rnp of the power battery under test when the frequency of the sine wave generated by the signal generation module Y1 is f2, i.e. w=2π×f2. Here, f2=10×f1.

From FIG. 4 and FIG. 5, it can be seen that the lower the frequency of the sine wave generated by the signal generation module Y1 is, the better the curve of the ratio F performs in the variation range of the insulation resistance Rnp, i.e., the more notably the ratio F varies. In other words, the greater the change of the voltage signal between the isolation capacitor C1 and the voltage division resistor R1 is, the higher the calculation accuracy of the insulation resistance Rnp of the power battery under test is.

Further, according to the formula (11), it can be understood that if it is desired to make the equivalent impedance Znp of the insulation resistance Rnp and the parasitic capacitance Cnp vary as the insulation resistance Rnp changes, the product of the parasitic capacitance Cnp and the angular frequency w should be smaller. Since the capacitance value of the parasitic capacitance Cnp is fixed, a relatively lower frequency should be selected when selecting the output frequency of the signal generation module Y1. The lower the output frequency is, the more notably the equivalent impedance Znp may vary as the insulation resistance Rnp changes, so that the calculation accuracy of the insulation resistance Rnp of the power battery under test can be improved.

It can be seen from the above that when the insulation resistance Rnp varies between Rmin/2 and Rmax/2, the change of the voltage signal between the isolation capacitor C1 and the voltage dividing resistor R1 is related to the magnitude of the output frequency of the signal generation module Y1. Therefore, in order to make the voltage signal between the isolation capacitor C1 and the voltage division resistor R1 significantly change as the insulation resistance Rnp varies between Rmin/2 and Rmax/2, the range of the output frequency of the signal generation module Y1 needs to be determined, and the output frequency of the signal generation module Y1 can be selected as low as possible.

Figure 6:
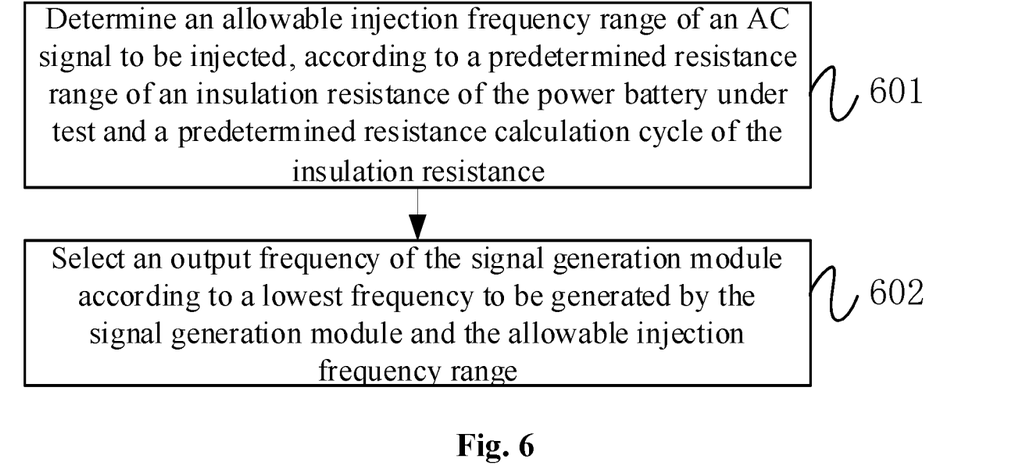
FIG. 6 is a flow chart of a parameter selection method for the insulation detection circuit according to a first embodiment of the present disclosure.

FIG. 6 is a schematic flow chart of a parameter selection method for an insulation detection circuit according to a first embodiment of the present disclosure. The parameter selection method shown in FIG. 6 includes steps 601 to 602.

In step 601, an allowable injection frequency range of an AC signal to be injected may be determined according to a predetermined resistance range of the insulation resistance of the power battery under test and a predetermined resistance calculation cycle of the insulation resistance.

In step 602, the output frequency of the signal generation module Y1 may be selected according to the lowest frequency that can be generated by the signal generation module Y1 and the allowable injection frequency range.

According to the embodiment of the present disclosure, when selecting an optimal output frequency of the signal generation module Y1, the allowable injection frequency range of the AC signal to be injected can be determined according to the predetermined resistance range of the insulation resistance of the power battery under test and the predetermined resistance calculation cycle of the insulation resistance, and then the output frequency of the signal generation module Y1 can be selected according to the lowest frequency that can be generated by the signal generation module Y1 and the allowable injection frequency range.

As described above, the frequency selection according to the lowest frequency that can be generated by the signal generation module Y1 follows the principle of selecting a frequency as low as possible, and the frequency selection according to the allowable injection frequency meets the requirements of the insulation detection circuit. Therefore, via the selection of the output frequency of the signal generation module Y1 by taking account of both the lowest frequency that can be generated by the signal generation module Y1 and the allowable injection frequency range, it is possible to make the voltage signal between the isolation capacitor C1 and the voltage division resistor R1 significantly change as the insulation resistance Rnp varies between Rmin/2 and Rmax/2, and thus further improve the detection accuracy of the insulation resistance Rnp.

Figure 7:
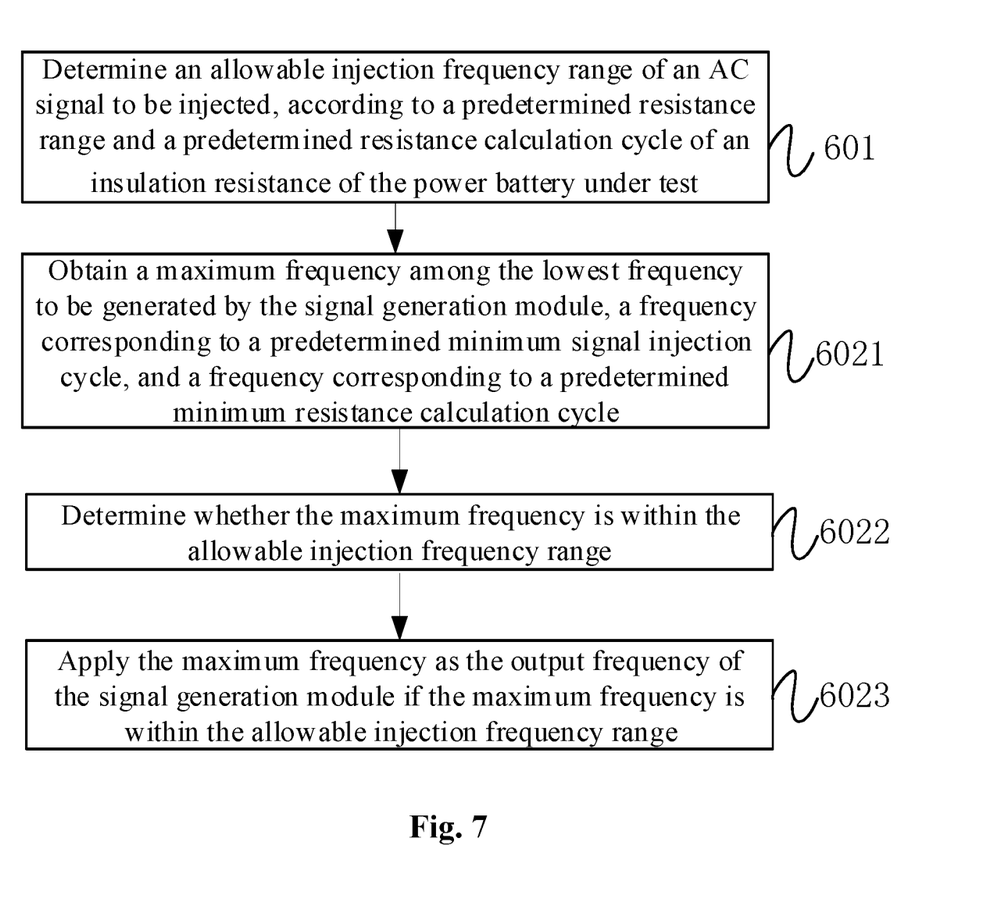
FIG. 7 is a flow chart of a parameter selection method for the insulation detection circuit according to a second embodiment of the present disclosure.

FIG. 7 is a flow chart of a parameter selection method for an insulation detection circuit according to a second embodiment of the present disclosure. FIG. 7 differs from FIG. 6 in that step 602 in FIG. 6 may be refined into steps 6021 to 6023 in FIG. 7.

In step 6021, a maximum frequency among the lowest frequency that can be generated by the signal generation module Y1, a frequency corresponding to a predetermined minimum signal injection cycle, and a frequency corresponding to a predetermined minimum resistance calculation cycle may be obtained.

Herein, the predetermined minimum signal injection cycle refers to a minimum signal injection cycle required by an insulation detection system.

In step 6022, it may be determined whether the maximum frequency is within the allowable injection frequency range.

In step 6023, if the maximum frequency is within the allowable injection frequency range, the maximum frequency may be applied as the output frequency of the signal generation module Y1.

In the embodiment of the present disclosure, when selecting an optimal output frequency of the signal generation module Y1, not only the lowest frequency that can be generated by the signal generation module Y1 but also the predetermined minimum signal injection cycle and the predetermined minimum resistance calculation cycle required by the insulation detection system can be taken into account. Therefore, the detection accuracy of the insulation resistance Rnp can be further improved.

Figure 8:
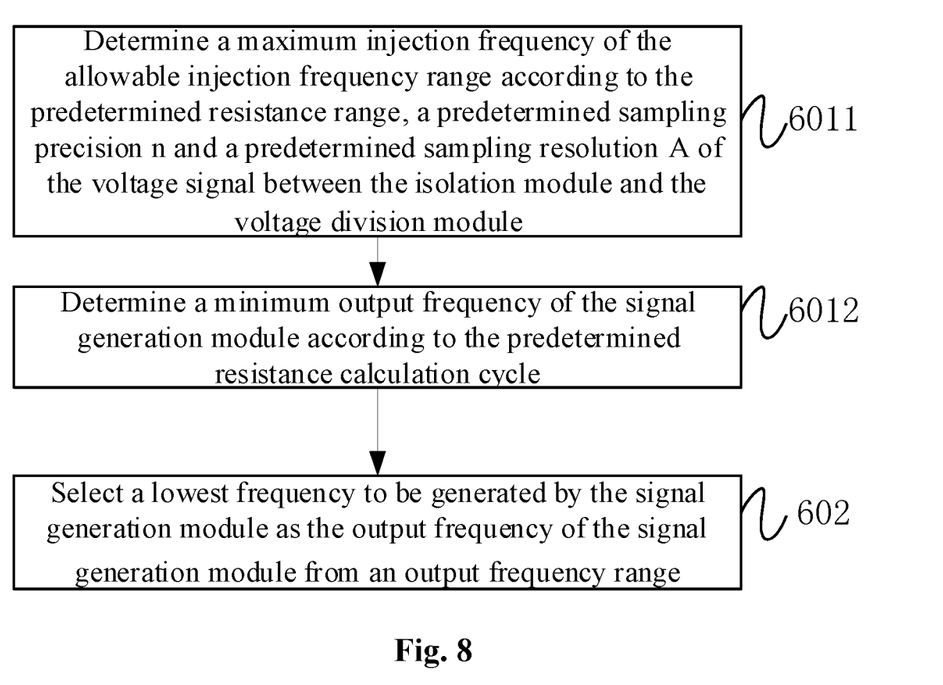
FIG. 8 is a flow chart of a parameter selection method for the insulation detection circuit according to a third embodiment of the present disclosure.

FIG. 8 is a flow chart of a parameter method for an insulation detection circuit according to a third embodiment of the present invention. FIG. 8 differs from FIG. 6 in that step 601 in FIG. 6 may be refined into steps 6011 and 6012 in FIG. 8.

In step 6011, a maximum injection frequency fmax of the signal generation module Y1 may be determined according to the predetermined resistance range, a predetermined sampling precision n and a predetermined sampling resolution A of the voltage signal between the isolation capacitor C1 and the voltage division resistor R1.

Here, the predetermined sampling resolution A refers to a minimum sampling resolution required by the insulation detection system. For example, assuming that the voltage signal between the isolation capacitor C1 and the voltage division resistor R1 is sampled by an ADC (Analog-to-Digital Converter), the calculation result of the phase shift θ will be valid only when a sampling frequency of the ADC is greater than a minimum sampling frequency corresponding to the minimum sampling resolution. Otherwise, the calculation result of the phase shift θ will not be valid because it is too small.

The process for deriving the maximum injection frequency of the signal generation module Y1 will be explained in detail below.

First, a first voltage amplitude of the voltage signal between the isolation capacitor C1 and the voltage division resistor R1 may be obtained when the insulation resistance of the power battery under a present output frequency is the maximum resistance Rmax/2 in the predetermined resistance range Rmin/2 to Rmax/2.

Then, a second voltage amplitude of the voltage signal between the isolation capacitor C1 and the voltage division resistor R1 may be obtained when the insulation resistance of the power battery under the present output frequency is 1+n times of the maximum resistance Rmax/2.

Next, a difference between the first voltage amplitude and the second voltage amplitude may be calculated.

In an optional embodiment, if the difference is equal to the predetermined sampling resolution A, the present output frequency may be applied as the maximum injection frequency of the signal generation module Y1.

In an optional embodiment, if the difference between the first voltage amplitude and the second voltage amplitude is equal to the predetermined sampling resolution A when the present output frequency is 5 Hz, then the frequency of 5 Hz may be used as the maximum injection frequency fmax of the signal generation module Y1.

In an alternative embodiment, if the difference is not equal to the predetermined sampling resolution A, then the output frequency of the signal generation module Y1 may be adjusted and the adjusted output frequency may be taken as a new present output frequency, until the difference calculated under the new present output frequency equals to the predetermined sampling resolution A.

In step 6012, a minimum injection frequency fmin of the signal generation module Y1 may be determined based on the predetermined resistance calculation cycle.

Specifically, an inverse of the predetermined resistance calculation cycle may be used as the minimum injection frequency of the signal generation module Y1. Since it is required to conduct the insulation resistance detection in real-time, the output frequency of the signal generation module Y1 cannot be selected too low. Assuming that the insulation resistance needs to be reported once in T seconds, the minimum output frequency of the signal generation module Y1 will be $$f\min = \frac{1}{T}.$$

In an optional embodiment, if the predetermined resistance calculation cycle is 10 seconds, the minimum injection frequency fmin of the signal generation module Y1 may be selected as 0.1 Hz.

According to the embodiments of the present disclosure, after the output frequency of the signal generation module Y1 is determined, the capacitance of the appropriate isolation capacitor C1 and the resistance of the voltage division resistor R1 may be selected appropriately.

When the insulation resistance Rnp varies within the predetermined resistance range Rmin/2 to Rmax/2, that is, when the equivalent impedance Znp of the power battery under test varies within the predetermined resistance range Rmin/2 to Rmax/2, the larger the ratio F is, the higher the calculation accuracy of Rnp will be. As can be seen from the formula (12), the impedance of the voltage division resistor R1 and the capacitive reactance of the isolation capacitor C1 should be equal to the impedance value of the equivalent impedance Znp of the power battery under test under a maximum sensitivity, so that the sampled signal between the isolation capacitor C1 and the voltage division resistor R1 can significantly change as the insulation resistance Rnp changes.

Specifically, with reference to the formula (11), a maximum value of the equivalent impedance Znp can be derived according to the determined output frequency of the signal generation module Y1, the predetermined resistance range (Rmin/2~Rmax/2) and the predetermined capacitance range (2Cmin~2Cmax).

When it is desired to select the capacitance of the isolation capacitor C1, the maximum value of the equivalent impedance Znp can be used as the capacitive reactance of the isolation capacitor C1, and then the capacitance of the isolation capacitor C1 can be derived by using a formula for capacitive reactance-capacitance calculation.

According to the embodiments of the present disclosure, the insulation detection circuit may further include an Analog-to-Digital Converter ADC (not shown in the figure) to acquire the voltage signal between the isolation capacitor C1 and the voltage division resistor R1. The sampled signal at half or two-thirds of a full scale of the ADC may be relatively sharp.

According to the embodiments of the present disclosure, when it is desired to select the resistance of the voltage division resistor R1, the resistance of the voltage division module F1 may be adjusted based on the maximum value of the equivalent impedance Znp, the determined output frequency of the signal generation module Y1 and the determined capacitance of the isolation capacitor C1, so that the voltage signal acquired by the ADC is between the half and the two-thirds of the full scale of the ADC. From the resistance range of the voltage division module in which any resistance causes that the voltage signal acquired by the ADC is between the half and the two-thirds of the full scale of the ADC, a resistance may be arbitrarily selected as a present resistance of the voltage division module to further improve the calculation accuracy of the insulation resistance Rnp.

Figure 9:
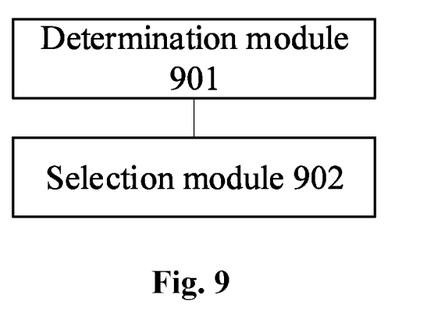
FIG. 9 is a schematic structural diagram of a parameter selection apparatus for the insulation detection circuit according to a first embodiment of the present disclosure.

FIG. 9 is a schematic structural diagram of a parameter selection apparatus for the insulation detection circuit according to a first embodiment of the present disclosure. The parameter selection apparatus shown in FIG. 9 may include a determination module 901 and a selection module 902.

The determination module 901 may be configured to determine an allowable injection frequency range of the AC signal to be injected according to a predetermined resistance range of the insulation resistance of the power battery under test and a predetermined resistance calculation cycle of the insulation resistance.

The selection module 902 may be configured to select the output frequency of the signal generation module Y1 according to the lowest frequency that can be generated by the signal generation module Y1 and the allowable injection frequency range.

Figure 10:
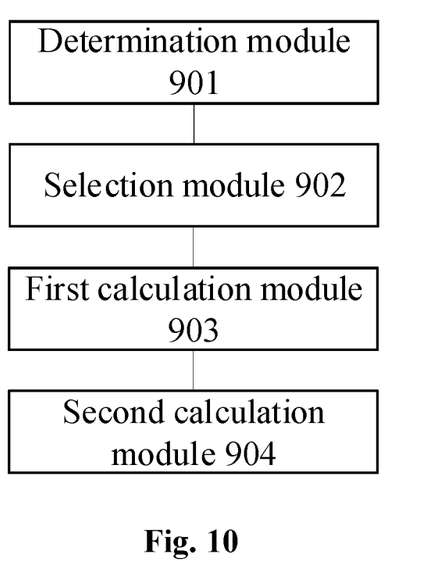
FIG. 10 is a schematic structural diagram of a parameter selection apparatus for the insulation detection circuit according to a second embodiment of the present disclosure.

FIG. 10 is a schematic structural diagram of a parameter selection apparatus for the insulation detection circuit according to a second embodiment of the present disclosure. FIG. 10 differs from FIG. 9 in that the parameter selection apparatus shown in FIG. 10 may further include a first calculation module 903 and a second calculation module 904.

The first calculation module 903 may be configured to obtain a maximum value of the equivalent impedance of the insulation resistance and the parasitic capacitance of the power battery under test according to the determined output frequency of the signal generation module, the predetermined resistance range and the predetermined capacitance range.

The second calculation module 904 may be configured to use the maximum value of the equivalent impedance as the capacitive reactance of the isolation module to obtain the capacitance of the isolation module.

In addition, the parameter selection apparatus of the insulation detection circuit in the embodiments of the present disclosure may further determine the resistance of the voltage module F1 according to the methods described above.

The embodiments of the present disclosure may further provide a parameter selection device for the insulation detection circuit. The parameter selection device includes a memory and a processor. The memory may be configured to store executable program codes, and the processor may be configured to read the executable program codes stored in the memory to perform a parameter selection method for the insulation detection circuit as described above.

The embodiments of the present disclosure may further provide a computer readable storage medium including instructions that, when executed on a computer, cause the computer to perform a parameter selection method for the insulation detection circuit as described above.

It should be noted that, each embodiment in the disclosure is described in a progressive manner, the same or similar parts in various embodiments may be referred to each other, and each embodiment focuses on differences from other embodiments. For the apparatus embodiments, reference may be made to the description of the method embodiments. The embodiments of the present disclosure are not limited to the specific steps and structures described above and shown in the drawings. A person skilled in the art may make various changes, modifications, and additions or change the order of steps after understanding the spirit of the embodiments of the present disclosure. Also, for the sake of conciseness, the detailed description of those known methods or techniques is omitted here.

The functional blocks shown in the block diagrams described above may be implemented in hardware, software, firmware, or a combination thereof. When implemented in hardware, it may be, for example, an electronic circuit, an application specific integrated circuit (ASIC), a suitable firmware, a plug-in, a function card or the like. When implemented in software, elements of the embodiments of the present disclosure are programs or code segments used to perform required tasks. The programs or code segments may be stored in a machine-readable medium or transmitted over a transmission medium or a communication link via data signals carried in carriers. The "machine-readable medium" may include any medium capable of storing or transmitting information. Examples of the machine-readable medium include an electronic circuit, a semiconductor memory device, a ROM, a flash memory, an erasable ROM (EROM), a floppy disk, a CD-ROM, an optical disk, a hard disk, a fiber medium, a radio frequency (RF) link, and the like. The code segments may be downloaded via a computer network, such as the Internet, an intranet, or the like.

The embodiments of the present disclosure may be implemented in other specific forms without departing from the spirit and essential characteristics thereof. For example, the algorithms described in the specific embodiments may be modified as long as the system architecture will not depart from the basic spirit of the embodiments of the present disclosure. The present embodiments are therefore to be considered in all respects as illustrative but not restrictive. The scopes of the embodiments are to be defined by the appended claims rather than the foregoing description. All the changes within the scope of the subject matters of the claims and their equivalents are thus to be included in the scope of the embodiments of the present disclosure.

What is claimed is:

1. A parameter selection method for an insulation detection circuit, wherein the insulation detection circuit comprises a signal generation module, a voltage division module, an isolation module, a first sampling point, a second sampling point and a processor, the isolation module comprises a first end configured to be connected to a positive electrode of a power battery under test and a second end connected to the second sampling point and is configured to isolate a voltage signal of the power battery under test, the signal generation module is connected to the first sampling point and configured to inject an AC signal to the power battery under test and provide the first sampling point with a first sampled signal of a predetermined frequency, the voltage division module comprises a first end connected to the first sampling point and a second end connected to the second sampling point and is configured to provide the second sampling point with a second sampled signal, and the processor is configured to calculate an insulation resistance of the power battery under test according to the first sampled signal and the second sampled signal, and the parameter selection method comprises:

determining an allowable injection frequency range of the AC signal, according to a predetermined resistance range of an insulation resistance of the power battery under test and a predetermined resistance calculation cycle of the insulation resistance;

obtaining a maximum frequency among a lowest frequency of an output signal of the signal generation module, a frequency corresponding to a predetermined minimum signal injection cycle, and a frequency corresponding to a predetermined minimum resistance calculation cycle;

determining whether the maximum frequency is within the allowable injection frequency range; and selecting the maximum frequency as an output frequency of the AC signal output by the signal generation module when the maximum frequency is within the allowable injection frequency range, wherein the determining an allowable injection frequency range of the AC signal comprises:

determining a maximum injection frequency of the allowable injection frequency range according to the predetermined resistance range, a predetermined sampling precision and a predetermined sampling resolution of the voltage signal between the isolation module and the voltage division module; and determining a minimum injection frequency of the allowable injection frequency range according to the predetermined resistance calculation cycle.

2. The parameter selection method of claim 1, wherein the determining a maximum injection frequency of the allowable injection frequency range according to the predetermined resistance range, a predetermined sampling precision and a predetermined sampling resolution of the voltage signal between the isolation module and the voltage division module comprises:

obtaining a first voltage amplitude of the voltage signal between the isolation module and the voltage division module when the insulation resistance of the power battery under a present output frequency of the signal generation module is a maximum resistance in the predetermined resistance range;

obtaining a second voltage amplitude of the voltage signal between the isolation module and the voltage division module when the insulation resistance of the power battery under the present output frequency of the signal generation module is 1+n times of the maximum resistance, wherein the n is the predetermined sampling precision;

calculating a difference between the first voltage amplitude and the second voltage amplitude;

when the difference is equal to the predetermined sampling resolution, applying the present output frequency as the maximum injection frequency of the allowable injection frequency range; and when the difference is not equal to the predetermined sampling resolution, adjusting the output frequency of the signal generation module and taking the adjusted output frequency as a new present output frequency until the calculated difference corresponding to the new present output frequency is equal to the predetermined sampling resolution.

3. The parameter selection method of claim 1, wherein the determining a minimum injection frequency of the allowable injection frequency range according to the predetermined resistance calculation cycle comprises:

applying an inverse of the predetermined resistance calculation cycle as the minimum injection frequency of the allowable injection frequency range.

4. The parameter selection method of claim 1, wherein the determining a maximum injection frequency of the allowable injection frequency range according to the predetermined resistance range, a predetermined sampling precision and a predetermined sampling resolution of the voltage signal between the isolation module and the voltage division module comprises:

obtaining a first voltage amplitude of the voltage signal between the isolation module and the voltage division module when the insulation resistance of the power battery under a present output frequency of the signal generation module is a maximum resistance in the predetermined resistance range;

obtaining a second voltage amplitude of the voltage signal between the isolation module and the voltage division module when the insulation resistance of the power battery under the present output frequency of the signal generation module is 1+n times of the maximum resistance, wherein the n is the predetermined sampling precision;

calculating a difference between the first voltage amplitude and the second voltage amplitude;

when the difference is equal to the predetermined sampling resolution, applying the present output frequency as the maximum injection frequency of the allowable injection frequency range; and when the difference is not equal to the predetermined sampling resolution, adjusting the output frequency of the signal generation module and taking the adjusted output frequency as a new present output frequency until the calculated difference corresponding to the new present output frequency is equal to the predetermined sampling resolution.

5. The parameter selection method of claim 1, wherein the determining a minimum injection frequency of the allowable injection frequency range according to the predetermined resistance calculation cycle comprises:

applying an inverse of the predetermined resistance calculation cycle as the minimum injection frequency of the allowable injection frequency range.

6. The parameter selection method of claim 1, wherein a maximum injection frequency of the allowable injection frequency range is 5 Hz.

7. The parameter selection method of claim 1, wherein a minimum injection frequency of the allowable injection frequency range is 0.1 Hz.

8. The parameter selection method of claim 1, further comprising:

obtaining a maximum value of an equivalent impedance of the insulation resistance and a parasitic capacitance of the power battery under test according to the selected output frequency of the signal generation module, the predetermined resistance range and a predetermined capacitance range; and deriving a capacitance of the isolation module by using the maximum value of the equivalent impedance as a capacitive reactance of the isolation module.

9. The parameter selection method of claim 1, wherein the insulation detection circuit further comprises an Analog-to-Digital Converter ADC to acquire the voltage signal between the isolation module and the voltage division module, and the parameter selection method further comprises:

adjusting the resistance of the voltage division module based on the maximum value of the equivalent impedance, the selected output frequency of the signal generation module and a determined capacitance of the isolation module, so that the voltage signal acquired by the ADC is between half and two-thirds of a full scale of the ADC; and from a resistance range of the voltage division module in which any resistance causes that the voltage signal acquired by the ADC is between the half and the two-thirds of the full scale of the ADC, selecting a resistance arbitrarily as a present resistance of the voltage division module.

10. A non-transitory computer readable storage medium having instructions stored thereon, wherein the instructions, when executed on a computer, cause the computer to perform the parameter selection method of claim 1 for the insulation detection circuit.

11. A parameter selection apparatus for an insulation detection circuit, wherein the insulation detection circuit comprises a signal generation module, a voltage division module, an isolation module, a first sampling point, a second sampling point and a processor, the isolation module comprises a first end configured to be connected to a positive electrode of a power battery under test and a second end connected to the second sampling point and is configured to isolate a voltage signal of the power battery under test, the signal generation module is connected to the first sampling point and configured to inject an AC signal to the power battery under test and provide the first sampling point with a first sampled signal of a predetermined frequency, the voltage division module comprises a first end connected to the first sampling point and a second end connected to the second sampling point and is configured to provide the second sampling point with a second sampled signal, and the processor is configured to calculate an insulation resistance of the power battery under test according to the first sampled signal and the second sampled signal, and the parameter selection apparatus comprises:

a processor; and a memory configured to store instructions executable by the processor, wherein the processor is configured to:
determine an allowable injection frequency range of the AC signal according to a predetermined resistance range of an insulation resistance of the power battery under test and a predetermined resistance calculation cycle of the insulation resistance;
obtain a maximum frequency among a lowest frequency of an output signal of the signal generation module, a frequency corresponding to a predetermined minimum signal injection cycle, and a frequency corresponding to a predetermined minimum resistance calculation cycle;
determine whether the maximum frequency is within the allowable injection frequency range; and
select the maximum frequency as an output frequency of the AC signal output by the signal generation module when the maximum frequency is within the allowable injection frequency range,
wherein the processor is further configured to determine the allowable injection frequency range of the AC signal by:
determining a maximum injection frequency of the allowable injection frequency range according to the predetermined resistance range, a predetermined sampling precision and a predetermined sampling resolution of the voltage signal between the isolation module and the voltage division module; and
determining a minimum injection frequency of the allowable injection frequency range according to the predetermined resistance calculation cycle.

12. The parameter selection apparatus of claim 11, wherein the processor is further configured to:
obtain a maximum value of an equivalent impedance of the insulation resistance and a parasitic capacitance of the power battery under test according to the selected output frequency of the signal generation module, the predetermined resistance range and a predetermined capacitance range; and
derive a capacitance of the isolation module by using the maximum value of the equivalent impedance as a capacitive reactance of the isolation module.

* * * * *